United States Patent
Yang et al.

(10) Patent No.: US 10,446,672 B2
(45) Date of Patent: Oct. 15, 2019

(54) TUNNEL FIELD-EFFECT TRANSISTOR AND TUNNEL FIELD-EFFECT TRANSISTOR PRODUCTION METHOD

(71) Applicant: Huawei Technologies Co., Ltd., Shenzhen, Guangdong (CN)

(72) Inventors: Xichao Yang, Shenzhen (CN); Chen-Xiong Zhang, Plano, TX (US)

(73) Assignee: HUAWEI TECHNOLOGIES CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/908,393

(22) Filed: Feb. 28, 2018

(65) Prior Publication Data

US 2018/0190802 A1 Jul. 5, 2018

Related U.S. Application Data

(63) Continuation of application No. PCT/CN2015/088754, filed on Sep. 1, 2015.

(51) Int. Cl.
*H01L 29/739* (2006.01)
*H01L 29/06* (2006.01)
(Continued)

(52) U.S. Cl.
CPC ............ *H01L 29/739* (2013.01); *H01L 29/06* (2013.01); *H01L 29/068* (2013.01);
(Continued)

(58) Field of Classification Search
CPC ........... H01L 29/66356; H01L 29/0895; H01L 29/7391; H01L 29/739; H01L 29/06; H01L 29/78
See application file for complete search history.

(56) References Cited

U.S. PATENT DOCUMENTS 7,777,282 B2   8/2010 Majhi et al.
2006/0118899 A1   6/2006 Jang et al.
(Continued)

FOREIGN PATENT DOCUMENTS

CN    102751325 A    10/2012
CN    104617137 A    5/2015
DE    102014018382 A1 *  6/2016   ....... H01L 29/66356

OTHER PUBLICATIONS

Huang et al.; "Self-Depleted T-gate Schottky Barrier Tunneling FET with Low Average Subthreshold Slope and High ION/IOFF by Gate Configuration and Barrier Modulation"; 2011 IEEE International Electron Devices Meeting; Washington, D.C., USA; Dec. 5-7, 2011; 4 pages.

(Continued)

*Primary Examiner* — Ermias T Woldegeorgis
(74) *Attorney, Agent, or Firm* — Womble Bond Dickinson (US) LLP

(57) ABSTRACT

A tunnel field-effect transistor (TFET) is provided. In the TFET, a channel region (202) connects a source region (201) and a drain region (203); a pocket layer (204) and a gate oxide layer (205) are successively produced between the source region and a gate region (206); a metal layer (208) is produced in a first area in the source region, the first area is located on a side on which the source region is in contact with the pocket layer, and the pocket layer covers at least a part of the metal layer; and the pocket layer and a second area in the source region form a first tunnel junction of the TFET, and the pocket layer and the metal layer form a second tunnel junction of the TFET.

19 Claims, 12 Drawing Sheets

(51) Int. Cl.
*H01L 29/78* (2006.01)
*H01L 29/66* (2006.01)
*H01L 29/08* (2006.01)

(52) U.S. Cl.
CPC ........ *H01L 29/0676* (2013.01); *H01L 29/083* (2013.01); *H01L 29/0834* (2013.01); *H01L 29/66356* (2013.01); *H01L 29/7391* (2013.01); *H01L 29/78* (2013.01)

(56) References Cited

U.S. PATENT DOCUMENTS

| | | | | |
|---|---|---|---|---|
| 2010/0123203 | A1* | 5/2010 | Bhuwalka | H01L 29/66356 257/402 |
| 2012/0299084 | A1* | 11/2012 | Saito | H01L 21/28282 257/324 |
| 2014/0054657 | A1* | 2/2014 | Hokazono | H01L 29/78 257/288 |
| 2014/0209863 | A1 | 7/2014 | Kondo et al. | |
| 2015/0364582 | A1* | 12/2015 | Goto | H01L 29/66977 257/12 |

OTHER PUBLICATIONS

Huang et al.; "Comprehensive Performance Re-assessment of TFETs with a Novel Design by Gate and Source Engineering from Device/Circuit Perspective"; 2014 IEEE International Electron Devices Meeting; San Francisco, CA, USA, Dec. 15-17, 2014; 4 pages.

* cited by examiner

TUNNEL FIELD-EFFECT TRANSISTOR AND TUNNEL FIELD-EFFECT TRANSISTOR PRODUCTION METHOD

CROSS-REFERENCE TO RELATED APPLICATIONS

This application is a continuation of International Application No. PCT/CN2015/088754, filed on Sep. 1, 2015, the disclosure of which is hereby incorporated by reference in its entirety.

TECHNICAL FIELD

The present application relates to the field of semiconductor technologies, and in particular, to a tunnel field-effect transistor and a tunnel field-effect transistor production method.

BACKGROUND

As semiconductor technologies rapidly develop, transistor integration density in a chip is increasingly high. In this case, reducing power consumption becomes a key challenge in chip design. A key to reduce power consumption is to reduce a supply voltage of a transistor, and a core restriction factor to reduce the supply voltage is a subthreshold swing of the transistor. A steep subthreshold change allows dramatic supply voltage reduction, so that the power consumption of the transistor is dramatically reduced. A TFET (Tunnel Field-Effect Transistor) is a transistor with a steep subthreshold feature. Therefore, the TFET has extremely great development potential in terms of device power consumption reduction.

FIG. 1 shows a schematic structural diagram of a TFET in the prior art. As shown in FIG. 1, the TFET in the prior art includes a heavily doped source region, a drain region, a channel region, a lightly doped pocket layer, a gate oxide layer, and a gate region, and the pocket layer is located between the gate oxide layer and the source region. Under an action of a gate electric field, carriers of the pocket layer are accumulated and finally form a tunnel junction with the source region, and carriers of the source region are tunneled to the pocket layer to form a current. In FIG. 1, 101 represents the source region, 102 represents the channel region, 103 represents the drain region, 104 represents the pocket layer, 105 represents the gate oxide layer, and 106 represents the gate region.

In an implementation process of the present disclosure, the inventor finds that the prior art has the following problems:

In the TFET shown in FIG. 1, the tunnel junction is formed by enlarging the pocket layer, a tunneling current of this structure is in direct proportion to an area of the pocket layer or carrier tunneling efficiency. The tunneling current may be increased by increasing the area of the pocket layer or the carrier tunneling efficiency. However, due to a technical limitation, it is difficult to increase the carrier tunneling efficiency in the TFET in FIG. 1. Therefore, the tunneling current may be increased by increasing only the area of the pocket layer, but a layout area of the TFET is increased when the area of the pocket layer is increased. In this case, TFET integrity density on a chip is reduced.

SUMMARY

To resolve a prior-art problem, embodiments of the present disclosure provide a TFET and a TFET production method. The technical solutions are as follows:

A first aspect provides a TFET, and the TFET includes a source region, a drain region, a channel region, a pocket layer, a gate oxide layer, and a gate region, where:

the channel region connects the source region and the drain region;

the pocket layer and the gate oxide layer are successively produced between the source region and the gate region, and the pocket layer is located on a side close to the source region;

a metal layer is produced in a first area in the source region, the first area is located on a side on which the source region is in contact with the pocket layer, and the pocket layer covers at least a part of the metal layer; and the pocket layer and a second area in the source region form a first tunnel junction of the tunnel field-effect transistor, the pocket layer and the metal layer form a second tunnel junction of the tunnel field-effect transistor, and the second area is an area other than the first area in the source region.

With reference to the first aspect, in a first possible implementation of the first aspect, the source region and the drain region are separately produced inside a semiconductor substrate;

the pocket layer is produced on a partial area of an upper surface of the semiconductor substrate; and the gate oxide layer and the gate region are successively produced on the pocket layer.

With reference to the first possible implementation of the first aspect, in a second possible implementation of the first aspect, an isolation wall is produced on either side of the pocket layer, either side of the gate oxide layer, and either side of the gate region; and a metal source electrode, a metal gate electrode, and a metal drain electrode are respectively produced at specified locations of the source region, the gate region, and the drain region, and the isolation wall is configured to isolate the metal source electrode, the metal gate electrode, and the metal drain electrode.

With reference to the first aspect, in a third possible implementation of the first aspect, the drain region is produced on a semiconductor substrate, the channel region is produced on a partial area in the drain region, and the source region is produced on the channel region;

the pocket layer entirely covers an area on either side of the source region and either side of the channel region; and the gate oxide layer and the gate region are successively produced outside the pocket layer.

With reference to the third possible implementation of the first aspect, in a fourth possible implementation of the first aspect, an isolation wall is produced on a side on which the gate layer is in contact with the drain region; and a metal source electrode, a metal gate electrode, and a metal drain electrode are respectively produced at specified locations of the source region, the gate region, and the drain region, and the isolation wall is configured to isolate the metal source electrode, the metal gate electrode, and the metal drain electrode.

With reference to the first or the third possible implementation of the first aspect, in a fifth possible implementation of the first aspect, the semiconductor substrate is made from one of bulk silicon, silicon-on-insulator, germanium-silicon, germanium, or an III-V compound semiconductor; and the pocket layer is made from one of silicon, the germanium-silicon, the germanium, or the III-V compound semiconductor.

With reference to the first or the third possible implementation of the first aspect, in a sixth possible implementation of the first aspect, the semiconductor substrate and the pocket layer are made from a same material or different materials.

With reference to the first aspect, in a seventh possible implementation of the first aspect, the gate region is made from either polycrystalline silicon or metal; and the gate oxide layer is made from one of silicon dioxide, silicon nitride, or a high dielectric material.

A second aspect further provides a TFET production method, and the production method includes:

separately producing a source region and a drain region, and producing a channel region between the source region and the drain region;

producing a gate region, and successively producing a pocket layer and a gate oxide layer between the source region and the gate region, where the pocket layer is produced on a side close to the source region; and producing a metal layer in a first area in the source region, where the first area is located on a side on which the source region is in contact with the pocket layer, and the pocket layer covers at least a part of the metal layer, so that the pocket layer and a second area in the source region form a first tunnel junction of the tunnel field-effect transistor, and the pocket layer and the metal layer form a second tunnel junction of the tunnel field-effect transistor, where the second area is an area other than the first area in the source region.

With reference to the second aspect, in a first possible implementation of the second aspect, the separately producing a source region and a drain region includes:

disposing a semiconductor substrate;

protecting a preset drain region in the semiconductor substrate by means of photoetching, and injecting a first ion into a preset source region in the semiconductor substrate;

protecting the source region by means of photoetching, and injecting a second ion into the preset drain region; and performing a rapid annealing process on a structure in which ion injection is completed, to generate the source region and the drain region.

With reference to the second aspect, in a second possible implementation of the second aspect, the separately producing a source region and a drain region includes:

disposing a semiconductor substrate;

producing the drain region on a specified area on the semiconductor substrate;

producing the channel region on the drain region; and producing the source region on the channel region.

With reference to the first possible implementation of the second aspect, in a third possible implementation of the second aspect, before the protecting a preset drain region in the semiconductor substrate by means of photoetching, and injecting a first ion into a preset source region in the semiconductor substrate, the method further includes:

producing a protection layer on the semiconductor substrate, where the protection layer is configured to protect the semiconductor substrate during ion injection into the preset source region and the preset drain region; and producing a sacrificial layer in a specified shape on the protection layer, where the sacrificial layer is configured to form the channel region by means of self-alignment during ion injection into the preset source region and the preset drain region, and the channel region connects the source region and the drain region.

With reference to the first or the second possible implementation of the second aspect, in a fourth possible implementation of the second aspect, the producing a metal layer in a first area in the source region includes:

depositing a metal film in the first area in the source region;

processing the metal film by using the annealing process to obtain the metal layer in the first area; and removing a metal film that is not processed in the annealing process.

With reference to the first or the second possible implementation of the second aspect, in a fifth possible implementation of the second aspect, the producing a metal layer in a first area in the source region includes:

when the semiconductor substrate and the pocket layer are made from different materials, protecting the drain region by means of photoetching, exposing the source region, and removing a material in the first area in the source region by means of etching, to form a trench; and filling the trench with metal or metal silicide, to obtain the metal layer in the first area.

With reference to the first possible implementation of the second aspect, in a sixth possible implementation of the second aspect, the producing a gate region, and successively producing a pocket layer and a gate oxide layer between the source region and the gate region includes:

on a partial area of an upper surface of the semiconductor substrate, successively growing a semiconductor film to serve as the pocket layer, growing a dielectric film by means of deposition to serve as the gate oxide layer, and depositing polycrystalline silicon or metal to serve as the gate region.

With reference to the second possible implementation of the second aspect, in a seventh possible implementation of the second aspect, the producing a gate region, and successively producing a pocket layer and a gate oxide layer between the source region and the gate region includes:

on either side of the channel region and the source region, successively growing a semiconductor film to serve as the pocket layer, growing a dielectric film by means of deposition to serve as the gate oxide layer, and depositing polycrystalline silicon or metal to serve as the gate region.

With reference to the second aspect, in an eighth possible implementation of the second aspect, after the depositing a metal layer in a first area in the source region, the method further includes:

depositing a metal layer in a partial area in the drain region.

With reference to the first possible implementation of the second aspect, in a ninth possible implementation of the second aspect, after the producing a gate region, and successively producing a pocket layer and a gate oxide layer between the source region and the gate region, the method further includes:

producing an isolation wall on either side of the pocket layer, either side of the gate oxide layer, and either side of the gate region; and respectively producing a metal source electrode, a metal gate electrode, and a metal drain electrode at specified locations of the source region, the gate region, and the drain region, where the isolation wall is configured to isolate the metal source electrode, the metal gate electrode, and the metal drain electrode.

With reference to the second possible implementation of the second aspect, in a tenth possible implementation of the second aspect, after the producing a gate region, and successively producing a pocket layer and a gate oxide layer between the source region and the gate region, the method further includes:

producing an isolation wall on aside on which the gate region is in contact with the drain region; and respectively producing a metal source electrode, a metal gate electrode, and a metal drain electrode at specified locations of the source region, the gate region, and the drain region, where the isolation wall is configured to isolate the metal source electrode, the metal gate electrode, and the metal drain electrode.

Beneficial effects of the technical solutions provided in the embodiments of the present disclosure are as follows:

The metal layer is produced in the first area in the source region, so that the pocket layer and the second area in which a non-metal layer is located in the source region form the first tunnel junction of the TFET, and the pocket layer and the metal layer form the second tunnel junction of the TFET. In this structure, when a gate control voltage of the TFET is greater than a threshold voltage, the TFET is in an enabling state. In this case, tunneling occurs at both the first tunnel junction and the second tunnel junction, and the second tunnel junction is a Schottky tunnel junction formed by metal and a semiconductor. A Schottky barrier has a relatively great band control capability and can reduce a tunneling distance, and tunneling efficiency can be improved when the tunneling distance is reduced. Therefore, compared with tunneling efficiency of a TFET whose tunnel junction is formed by only a pocket layer and a source region, carrier tunneling efficiency of the TFET is higher, so that a tunneling current of the TFET can be increased. Therefore, the tunneling current is increased without increasing an area of the pocket layer, so that a layout area of the TFET is not excessively large, thereby improving TFET integration density on a chip.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

Figure 1:
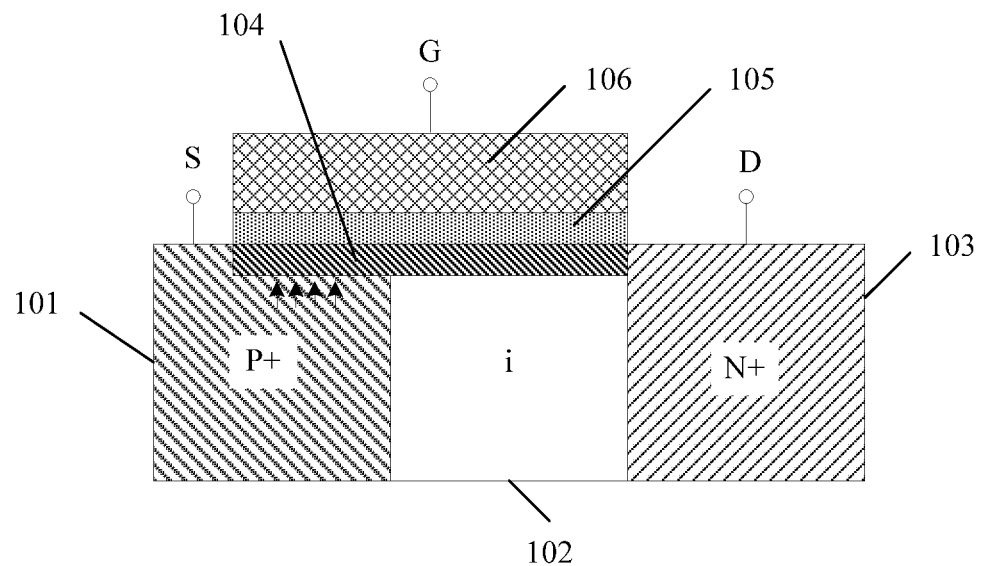
FIG. 1 is a schematic structural diagram of a prior-art TFET according to an embodiment of the present disclosure.

To make the objectives, technical solutions, and advantages of the present disclosure clearer, the following further describes the embodiments of the present disclosure in detail with reference to the accompanying drawings.

An embodiment of the present disclosure provides a TFET. The TFET includes a source region, a drain region, a channel region, a pocket layer, a gate oxide layer, and a gate region.

The channel region connects the source region and the drain region. The pocket layer and the gate oxide layer are successively produced between the source region and the gate region, and the pocket layer is located on a side close to the source region. A metal layer is produced in a first area in the source region, the first area is located on a side on which the source region is in contact with the pocket layer, and the pocket layer covers at least a part of the metal layer. The pocket layer and a second area in the source region form a first tunnel junction of the TFET, the pocket layer and the metal layer form a second tunnel junction of the TFET, and the second area is an area other than the first area in the source region.

There may be a plurality of location relationships among the source region, the drain region, and the channel region. This embodiment of the present disclosure provides detailed description in subsequent content. A location relationship among the pocket layer, the gate oxide layer, and the gate region is related to a location relationship among the source region, the drain region, and the channel region. With reference to the location relationship among the source region, the drain region, and the channel region, locations of the pocket layer, the gate oxide layer, and the gate region are described in detail in the subsequent content.

With reference to a structure of the foregoing TFET, it can be learned that a tunnel junction of the TFET provided in this embodiment of the present disclosure is formed by two parts: the first tunnel junction of the TFET formed by the pocket layer and the second area in the source region, and the second tunnel junction of the TFET formed by the pocket layer and the metal layer. The second tunnel junction formed by the pocket layer and the metal layer is a Schottky tunnel junction. Doping density of the pocket layer is less than doping density of the source region.

In the TFET, the gate region is configured to determine enabling and disabling of the TFET. When a gate control voltage of the TFET is less than a threshold voltage, the TFET is in a disabling state, and a subthreshold feature of the TFET is controlled by the first tunnel junction, that is, a steep subthreshold swing of a conventional tunneling mechanism is maintained. When a gate control voltage of the TFET is greater than a threshold voltage, the device is in an enabling state. In this case, the first tunnel junction is enabled, that is, tunneling occurs at the first tunnel junction, and in addition, the second tunnel junction is also enabled, that is, tunneling occurs at the second tunnel junction. A Schottky barrier has a relatively great band control capability and can reduce a tunneling distance, and tunneling efficiency can be improved when the tunneling distance is reduced. Therefore, compared with tunneling efficiency of a TFET including only a tunnel junction formed by a pocket layer and a source region, carrier tunneling efficiency of the TFET is higher, so that a tunneling current of the TFET can be increased.

In addition, the metal layer is close to the side on which the source region is in contact with the pocket layer, and forms the second tunnel junction with the pocket layer, and the pocket layer and the second area in which a non-metal layer is located in the source region form the first tunnel junction. Therefore, the first tunnel junction is closer to the channel region compared with the second tunnel junction. It means that a barrier is disposed between the metal layer and the channel region, so that current leakage can be suppressed when the TFET is in a disabling state.

In this embodiment of the present disclosure, the gate region is made from either polycrystalline silicon or metal, the gate oxide layer is made from one of silicon dioxide ($SiO_2$), silicon nitride ($Si_3N_4$), or a high dielectric material, and the pocket layer is made from one of silicon, germanium-silicon, germanium, or an III-V compound semiconductor. The metal layer is made from metal silicide generated after metal chemically reacts with a semiconductor in the source region.

According to the TFET provided in this embodiment of the present disclosure, the metal layer is produced in the first area in the source region, so that the pocket layer and the second area in which a non-metal layer is located in the source region form the first tunnel junction of the TFET, and the pocket layer and the metal layer form the second tunnel junction of the TFET. In this structure, when a gate control voltage of the TFET is greater than a threshold voltage, the TFET is in an enabling state. In this case, tunneling occurs at both the first tunnel junction and the second tunnel junction, and the second tunnel junction is a Schottky tunnel junction formed by metal and a semiconductor. A Schottky barrier has a relatively great band control capability and can reduce a tunneling distance, and tunneling efficiency can be improved when the tunneling distance is reduced. Therefore, compared with tunneling efficiency of a TFET whose tunnel junction is formed by only a pocket layer and a source region, carrier tunneling efficiency of the TFET is higher, so that a tunneling current of the TFET can be increased. Therefore, the tunneling current is increased without increasing an area of the pocket layer, so that a layout area of the TFET is not excessively large, thereby improving TFET integration density on a chip.

Figure 2:
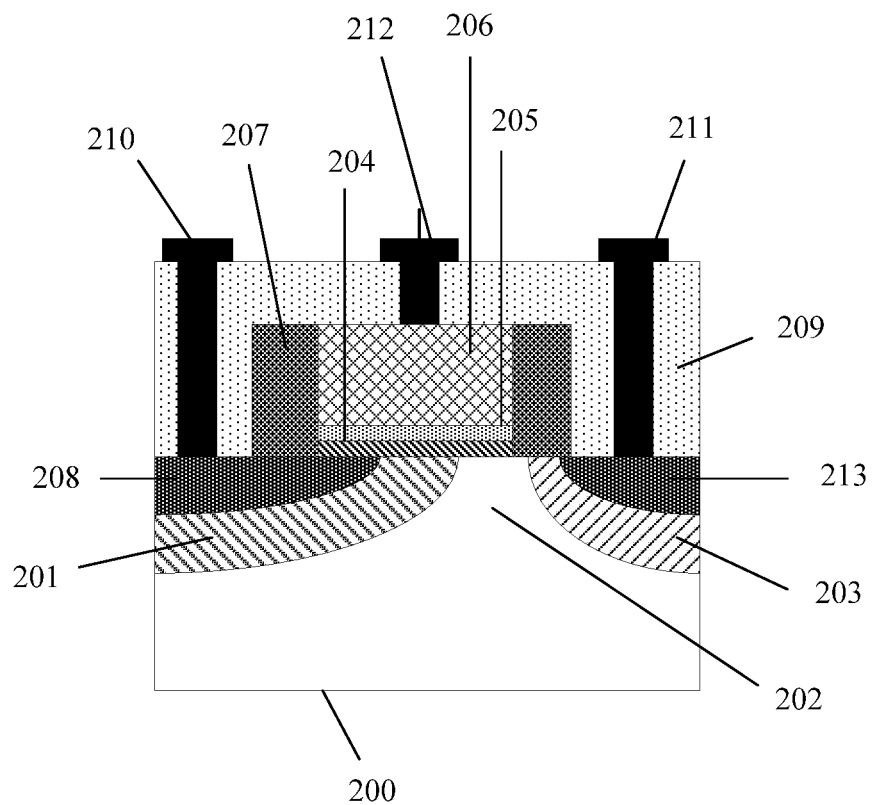
FIG. 2 is a schematic structural diagram of a TFET according to another embodiment of the present disclosure.

With reference to content of the foregoing embodiment, FIG. 2 is a schematic structural diagram of a TFET according to another embodiment of the present disclosure. The embodiment corresponding to FIG. 2 specifically illustrates a location relationship among a source region, a drain region, and a channel region, a location relationship among a pocket layer, a gate oxide layer, and a gate region and the location relationship among a source region, a drain region, and a channel region.

As shown in FIG. 2, in the TFET provided in this embodiment of the present disclosure, a source region 201 and a drain region 203 are separately produced inside a semiconductor substrate 200, and a channel region 202 is produced between the source region 201 and the drain region 203. A pocket layer 204 is produced on a partial area of an upper surface of the semiconductor substrate 200, and a gate oxide layer 205 and a gate region 206 are successively produced on the pocket layer 204. In this embodiment, the pocket layer 204 is in contact with a part of a metal layer 208, that is, the pocket layer 204 covers a part of the metal layer 208, and the pocket layer 204 is not in contact with the drain region 203. The pocket layer 204 is not in contact with the drain region 203, so that an electric leakage possibility of the TFET can be reduced, and performance of the TFET can be improved. In FIG. 2, 208 represents the metal layer, an area covered by 208 is a first area in the source region 201. An area other than the first area in the source region 201 is a second area.

The semiconductor substrate 200 is made from one of bulk silicon, silicon-on-insulator (SOI), germanium-silicon, germanium, or an III-V compound semiconductor. The pocket layer 204 is made from one of silicon, the germanium-silicon, the germanium, or the III-V compound semiconductor. The semiconductor substrate 200 and the pocket layer 204 may be made from a same material or different materials. Because the channel region 202 is a partial area on the semiconductor substrate 200, the channel region 202 and the semiconductor substrate 200 are made from a same material. The channel region 202 is a conductive path of a carrier from the source region to the drain region. The gate oxide layer 205 is made from one of silicon dioxide material ($SiO_2$), silicon nitride ($Si_3N_4$), or a high dielectric material.

Referring to FIG. 2, in an optional implementation solution, an isolation wall 207 is produced on either side of the pocket layer 204, either side of the gate oxide layer 205, and either side of the gate region 206. The isolation wall 207 is made from an insulating material such as silicon nitride. A periphery of the gate region 206 and a periphery of the isolation wall 207 may be filled with a low dielectric material 209 such as silicon dioxide ($SiO_2$) or silicon nitride ($Si_3N_4$). In addition, a metal source electrode 210, a metal gate electrode 212, and a metal drain electrode 211 are respectively produced at specified locations of the source region 201, the gate region 206, and the drain region 203.

Because the isolation wall 207 is made from the insulating material, the isolation wall 207 may be configured to isolate the metal source electrode 210, the metal gate electrode 212, and the metal drain electrode 211, so as to avoid a short circuit. In addition, based on the material of the isolation wall 207, the isolation wall 207 has relatively favorable mechanical performance, and the gate region 206, the pocket layer 204, and the gate oxide layer 205 can be in fixed shapes. The pocket layer 204 is disposed directly above the source region 201, and the isolation wall 207 is disposed for blocking. Therefore, when the pocket layer 204 and the source region 201 form a tunnel junction, a bottom-up tunneling direction of the TFET can be ensured, that is, the tunneling direction is vertical instead of horizontal.

The low dielectric material 209 is filled, so that a parasitic capacitor of the TFET can be relatively small. In addition, the low dielectric material can mechanically support the metal source electrode 210, the metal gate electrode 212, and the metal drain electrode 211.

It should be noted that the "specified locations" in this embodiment are preset locations at which the metal source electrode 210, the metal gate electrode 212, and the metal drain electrode 211 are produced. For example, the specified locations may be any location that is located on an upper surface of the source region 201 and that is not covered by the isolation wall 207, any location on an upper surface of the gate region 206, and any location that is located on an upper surface of the drain region 203 and that is not covered by the isolation wall 207.

In addition, the foregoing content is described by using an example in which the metal layer 208 is produced in a partial area in the source region 201. However, during specific implementation, a metal layer 213 may be produced in a partial area in the drain region 203. In the TFET shown in FIG. 2, in addition to producing the metal layer 208 in the partial area in the source region 201, a metal layer is also produced in the partial area in the drain region 203. A material of the metal layer produced in the drain region 203 is the same as that of the metal layer produced in the source region 201, and this can reduce contact resistance.

Figure 3:
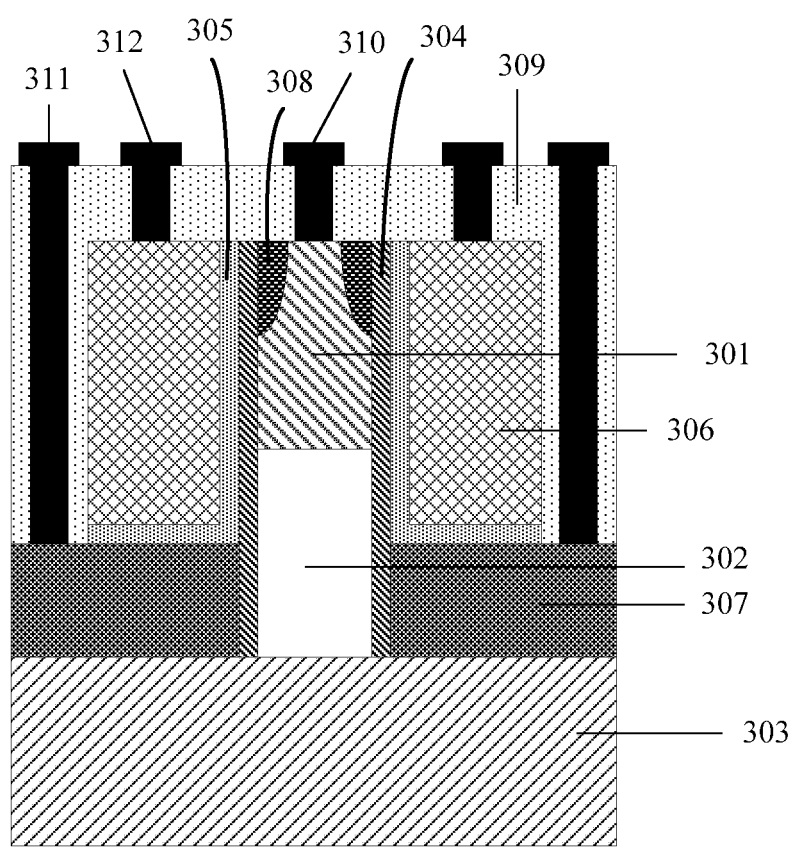
FIG. 3 is a schematic structural diagram of a TFET according to another embodiment of the present disclosure.

With reference to content of the foregoing embodiment, FIG. 3 is a schematic structural diagram of a TFET according to another embodiment of the present disclosure. The TFET shown in FIG. 3 is a vertical nanowire device. The embodiment corresponding to FIG. 3 specifically illustrates another location relationship among a source region, a drain region, and a channel region, another location relationship among a pocket layer, a gate oxide layer, and a gate region, and the another location relationship among a source region, a drain region, and a channel region.

As shown in FIG. 3, in the TFET provided in this embodiment of the present disclosure, a drain region 303 is produced on a semiconductor substrate (FIG. 3 does not show the semiconductor substrate), a channel region 302 is produced on a partial area on the drain region 303, and a source region 301 is produced on the channel region 302. A pocket layer 304 entirely covers an area on either side of the source region 301 and either side of the channel region 302. A gate oxide layer 305 and a gate region 306 are successively produced outside the pocket layer 304, and the gate region 306 is surrounded by the gate oxide layer 305 in an "L" shape. In this embodiment, the pocket layer 304 covers a metal layer 308 in a tunneling direction of a tunnel junction formed by the pocket layer 304 and the metal layer 308. Referring to FIG. 3, a tunneling direction of the TFET is horizontal, that is, the tunneling direction is an extension direction from the metal layer 308 to the pocket layer 304.

The TFET provided in this embodiment of the present disclosure is short gate-control, and a gate control range is limited to only the pocket layer 304 on the source region 301 and a part of the pocket layer 304 on the channel region 302, so that gate control does not affect the drain region 303. Specifically, the pocket layer 304 may be not in contact with the drain region 303, so as to reduce an electric leakage possibility of the TFET, and improve performance of the TFET. In this embodiment, a shape of the metal layer 308 is sickle-shaped.

The semiconductor substrate is made from one of bulk silicon, silicon-on-insulator, germanium-silicon, germanium, or an III-V compound semiconductor. The pocket layer 304 is made from one of silicon, the germanium-silicon, the germanium, or the III-V compound semiconductor. The semiconductor substrate and the pocket layer 304 may be made from a same material or different materials.

In an optional embodiment, still as shown in FIG. 3, an isolation wall 307 is produced on a side on which the gate region 306 is in contact with the drain region 303. A low dielectric material 309 is produced on a periphery of the gate region 306, a periphery of the gate oxide layer 305, a periphery of the pocket layer 304, a periphery of the metal layer 308, and a periphery of the source region 301. The "periphery" herein is an area that is not covered by another film layer. A metal source electrode 310, a metal gate electrode 312, and a metal drain electrode 311 are respectively produced at specified locations of the source region 301, the gate region 306, and the drain region 303. It should be noted that the "specified locations" in this embodiment are preset locations at which the metal source electrode 310, the metal gate electrode 312, and the metal drain electrode 311 are produced. For example, the specified locations may be any location on an upper surface of the source region 301, any location on an upper surface of the gate region 306, and any location on the isolation wall 307 that covers the drain region 303.

Materials, functions, and the like of the isolation wall 307 and the low dielectric material 309 are described in the embodiment corresponding to FIG. 2. For details, refer to content in FIG. 2, and details are not described herein again.

It should be noted that the foregoing content is described by using an example in which the metal layer 308 is produced in a partial area in the source region 301. However, during specific implementation, a metal layer may also be produced in a partial area in the drain region 303 (FIG. 3 does not show the metal layer produced in the drain region 303). A manner for producing a metal layer in the drain region 303 and a material of the metal layer are the same as a manner for producing a metal layer in the source region 301 and a material of the metal layer, and details are not described herein again. Producing the metal layer in the drain region 303 can reduce contact resistance.

Figure 4:
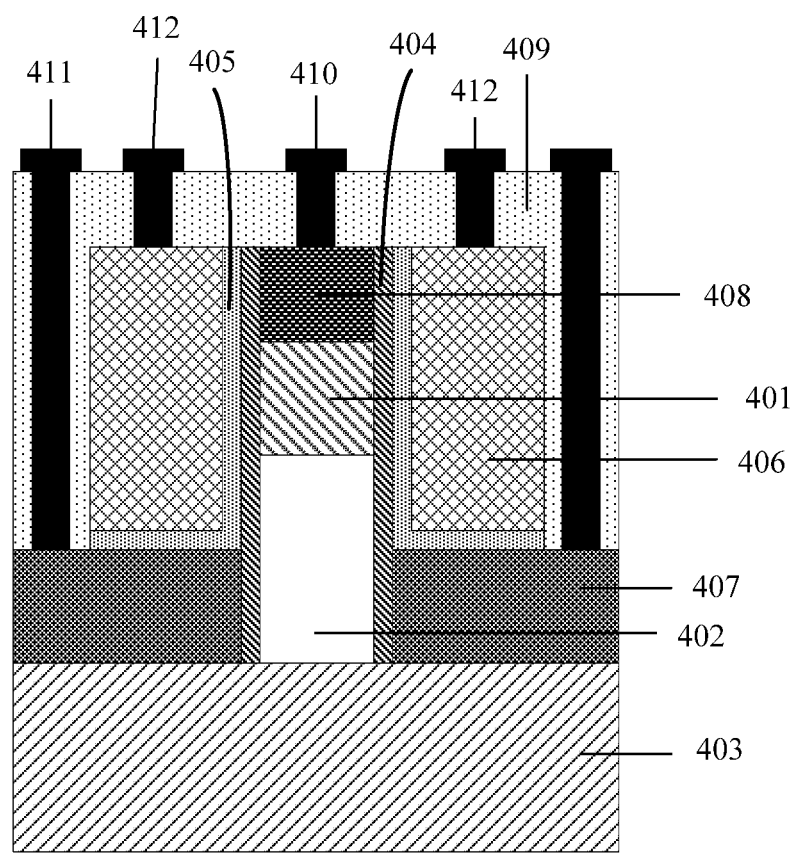
FIG. 4 is a schematic structural diagram of a TFET according to another embodiment of the present disclosure.

In addition, an example in which a shape of the metal layer 308 is sickle-shaped is used in FIG. 3 for description. However, during specific implementation, the shape of the metal layer 308 may be of another shape, such as a rectangle. FIG. 4 is a schematic structural diagram of a TFET according to another embodiment of the present disclosure. A difference between the TFET in FIG. 4 and the TFET in FIG. 3 lies in that a shape of a metal layer 408 in a source region 401 is different. In FIG. 4, the shape of the metal layer 408 is a rectangle. Specifically, in FIG. 4, 401 represents a source region, 402 represents a channel region, 403 represents a drain region, 404 represents a pocket layer, 405 represents a gate oxide layer, 406 represents a gate region, 408 represents the metal layer, 409 represents a low dielectric material, 410 represents a metal source electrode, 411 represents a metal drain electrode, and 412 represents a metal gate electrode. It can be seen from FIG. 4 that the metal layer in FIG. 4 is a rectangle.

Figure 5:
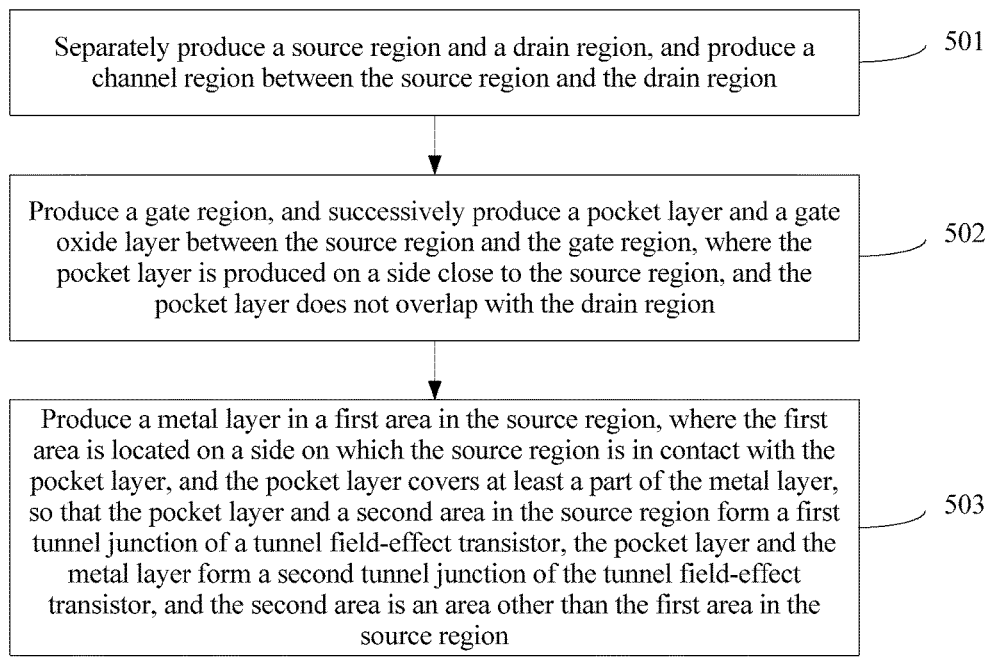
FIG. 5 is a flowchart of a TFET production method according to another embodiment of the present disclosure.

With reference to content of embodiments corresponding to FIG. 2 to FIG. 4, an embodiment of the present disclosure provides a TFET production method. The production method may be used to produce the TFET provided in the embodiments corresponding to FIG. 2 to FIG. 4. FIG. 5 is a flowchart of a TFET production method according to an embodiment of the present disclosure. As shown in FIG. 5, the TFET production method provided in this embodiment of the present disclosure includes the following steps:

501. Separately produce a source region and a drain region, and produce a channel region between the source region and the drain region.

502. Produce a gate region, and successively produce a pocket layer and a gate oxide layer between the source region and the gate region, where the pocket layer is produced on a side close to the source region.

503. Produce a metal layer in a first area in the source region, where the first area is located on a side on which the source region is in contact with the pocket layer, and the pocket layer covers at least a part of the metal layer, so that the pocket layer and a second area in the source region form a first tunnel junction of a tunnel field-effect transistor, the pocket layer and the metal layer form a second tunnel junction of the tunnel field-effect transistor, and the second area is an area other than the first area in the source region.

According to the TFET production method provided in this embodiment of the present disclosure, the metal layer is produced in the first area in the source region, so that the pocket layer and the second area in which a non-metal layer is located in the source region form the first tunnel junction of the TFET, and the pocket layer and the metal layer form the second tunnel junction of the TFET. In this structure, when a gate control voltage of the TFET is greater than a threshold voltage, the TFET is in an enabling state. In this case, tunneling occurs at both the first tunnel junction and the second tunnel junction, and the second tunnel junction is a Schottky tunnel junction formed by metal and a semiconductor. A Schottky barrier has a relatively great band control capability and can reduce a tunneling distance, and tunneling efficiency can be improved when the tunneling distance is reduced. Therefore, compared with tunneling efficiency of a TFET whose tunnel junction is formed by only a pocket layer and a source region, carrier tunneling efficiency of the TFET is higher, so that a tunneling current of the TFET can be increased. Therefore, the tunneling current is increased without increasing an area of the pocket layer, so that a layout area of the TFET is not excessively large, thereby improving TFET integration density on a chip.

In another embodiment, the separately producing a source region and a drain region includes:
disposing a semiconductor substrate;
protecting a preset drain region in the semiconductor substrate by means of photoetching, and injecting a first ion into a preset source region in the semiconductor substrate;
protecting the source region by means of photoetching, and injecting a second ion into the preset drain region; and
performing a rapid annealing process on a structure in which ion injection is completed, to generate the source region and the drain region.

In another embodiment, the separately producing a source region and a drain region includes:
disposing a semiconductor substrate;
producing the drain region on a specified area on the semiconductor substrate;
producing the channel region on the drain region; and
producing the source region on the channel region.

In another embodiment, before the protecting a preset drain region in the semiconductor substrate by means of photoetching, and injecting a first ion into a preset source region in the semiconductor substrate, the method further includes:
producing a protection layer on the semiconductor substrate, where the protection layer is configured to protect the semiconductor substrate during ion injection into the preset source region and the preset drain region; and
producing a sacrificial layer in a specified shape on the protection layer, where the sacrificial layer is configured to form the channel region by means of self-alignment during ion injection into the preset source region and the preset drain region, and the channel region connects the source region and the drain region.

In another embodiment, the producing a metal layer in a first area in the source region includes:
depositing a metal film in the first area in the source region;
processing the metal film by using the annealing process to obtain the metal layer in the first area; and
removing a metal film that is not processed in the annealing process.

In another embodiment, the producing a metal layer in a first area in the source region includes:
when the semiconductor substrate and the pocket layer are made from different materials, protecting the drain region by means of photoetching, exposing the source region, and removing a material in the first area in the source region by means of etching, to form a trench; and
filling the trench with metal or metal silicide, to obtain the metal layer in the first area.

In another embodiment, the producing a gate region, and successively producing a pocket layer and a gate oxide layer between the source region and the gate region includes:
on a partial area of an upper surface of the semiconductor substrate, successively growing a semiconductor film to serve as the pocket layer, growing a dielectric film by means of deposition to serve as the gate oxide layer, and depositing polycrystalline silicon or metal to serve as the gate region.

In another embodiment, the producing a gate region, and successively producing a pocket layer and a gate oxide layer between the source region and the gate region includes:
on either side of the channel region and the source region, successively growing a semiconductor film to serve as the pocket layer, growing a dielectric film by means of deposition to serve as the gate oxide layer, and depositing polycrystalline silicon or metal to serve as the gate region.

In another embodiment, after the depositing a metal layer in a first area in the source region, the method further includes:
depositing a metal layer in a partial area in the drain region.

In another embodiment, after the producing a gate region, and successively producing a pocket layer and a gate oxide layer between the source region and the gate region, the method further includes:
producing an isolation wall on either side of the pocket layer, either side of the gate oxide layer, and either side of the gate region; and
respectively producing a metal source electrode, a metal gate electrode, and a metal drain electrode at specified locations of the source region, the gate region, and the drain region, where the isolation wall is configured to isolate the metal source electrode, the metal gate electrode, and the metal drain electrode.

In another embodiment, after the producing a gate region, and successively producing a pocket layer and a gate oxide layer between the source region and the gate region, the method further includes:
producing an isolation wall on aside on which the gate region is in contact with the drain region; and
respectively producing a metal source electrode, a metal gate electrode, and a metal drain electrode at specified locations of the source region, the gate region, and the drain region, where the isolation wall is configured to isolate the metal source electrode, the metal gate electrode, and the metal drain electrode.

It should be noted that all the foregoing optional technical solutions may be randomly combined to form optional embodiments of the present disclosure, and details are not described herein.

Figure 6:
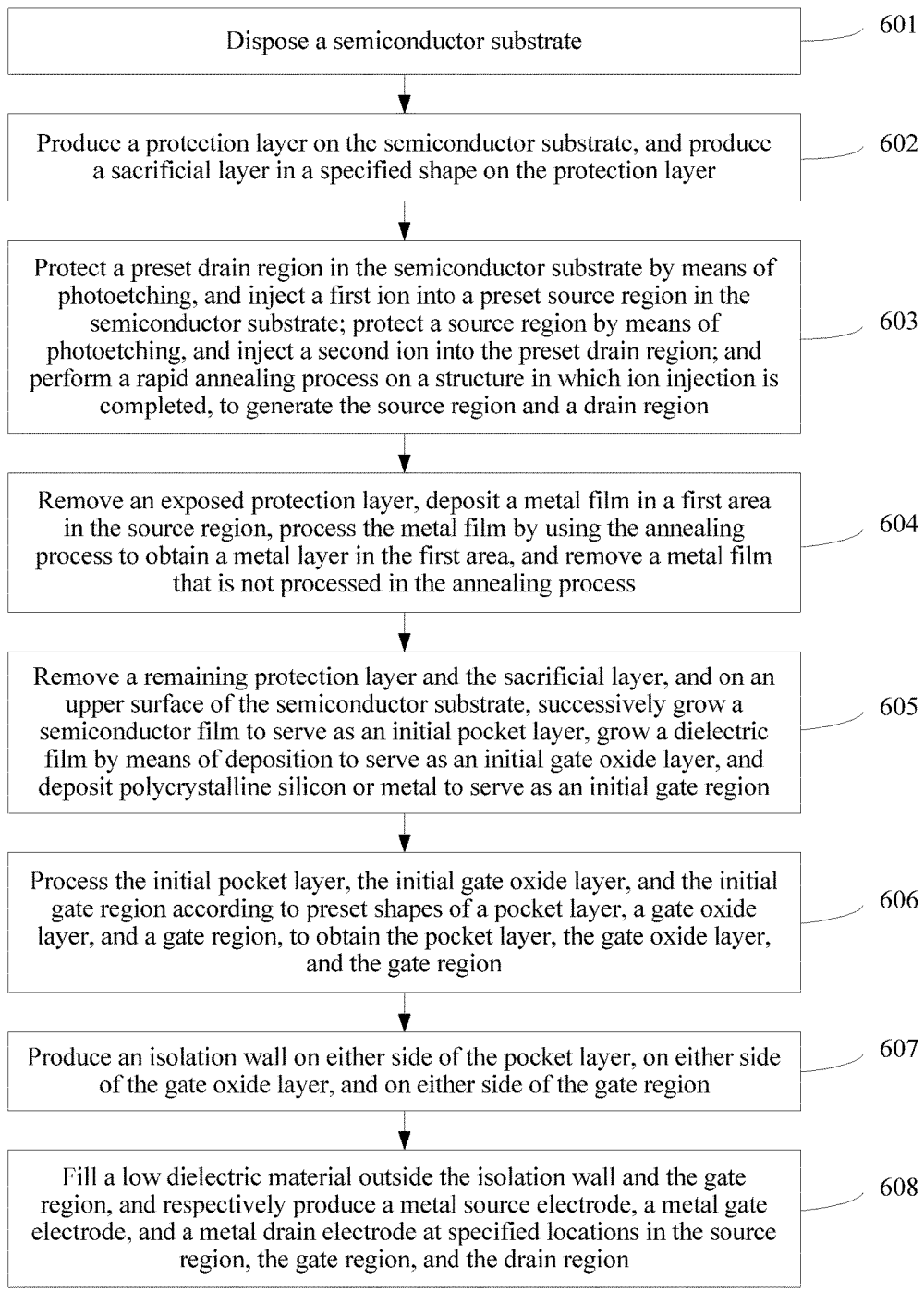
FIG. 6 is a flowchart of a TFET production method according to another embodiment of the present disclosure.

With reference to content of the foregoing embodiments, for ease of understanding, an example of producing the TFET shown in FIG. 2 is used in this embodiment of the present disclosure, to describe a TFET production method in detail provided in this embodiment of the present disclosure. As shown in FIG. 6, FIG. 6 shows a flowchart of a TFET production method. The production method may be used to produce the TFET shown in FIG. 2, and the production method includes the following steps.

601. Dispose a semiconductor substrate.

Figure 7:
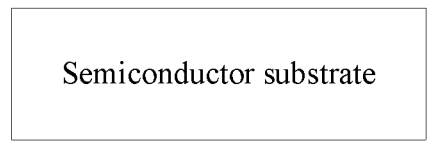
FIG. 7 is a schematic diagram of a semiconductor substrate according to another embodiment of the present disclosure.

As shown in FIG. 7, FIG. 7 shows a schematic diagram of the semiconductor substrate. A material of the semiconductor substrate is described in the foregoing embodiments. For details, refer to content in the foregoing embodiments, and details are not described herein again.

602. Produce a protection layer on the semiconductor substrate, and produce a sacrificial layer in a specified shape on the protection layer.

Figure 8:
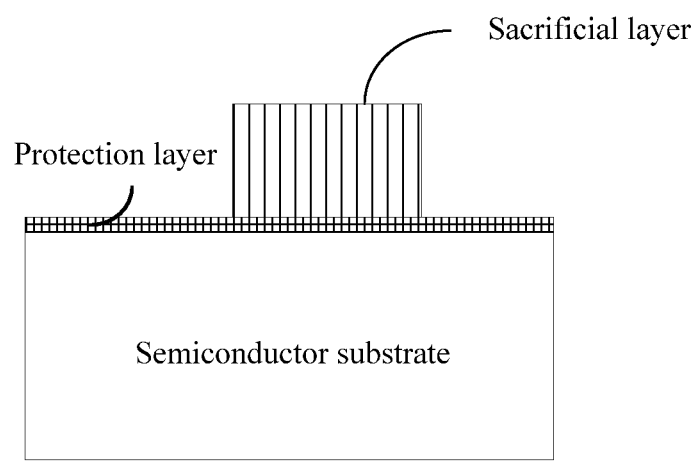
FIG. 8 is a schematic diagram of a protection layer and a sacrificial layer according to another embodiment of the present disclosure.

The protection layer is configured to protect the semiconductor substrate when the source region and the drain region are formed in the semiconductor substrate by means of ion injection. The sacrificial layer is configured to form a channel region by means of self-alignment when the source region and the drain region are formed in the semiconductor substrate by means of ion injection. The specified shape may be a rectangle or the like. It should be noted that to prevent ions injected to the source region and the drain region from spreading to the channel region during subsequent ion injection, a length of the sacrificial layer on the protection layer is greater than a length of a preset channel region. For example, if the length of the preset channel region is 200 nm, the length of the sacrificial layer may be 250 nm. As shown in FIG. 8, FIG. 8 shows a schematic diagram of the protection layer and the sacrificial layer. Referring to FIG. 8, a corresponding semiconductor area below the sacrificial layer is an area in which the preset channel region is located.

Specifically, there may be a plurality of manners for producing the protection layer and the sacrificial layer. For example, the protection layer may be produced on the semiconductor substrate in a deposition growing manner, the sacrificial layer may be produced on the protection layer by means of photoetching and etching, and a shape of the sacrificial layer is defined. The protection layer may be made from silicon dioxide or the like, and the sacrificial layer may be made from a silicon or the like.

It should be noted that this step is an optional step, so as to protect the semiconductor substrate when ions are subsequently injected into the semiconductor substrate. Certainly, only an example of generating the protection layer and the sacrificial layer is used herein to describe a semiconductor substrate protection manner. However, during specific implementation, another manner may be used.

603. Protect a preset drain region in the semiconductor substrate by means of photoetching, and inject a first ion into a preset source region in the semiconductor substrate; protect a source region by means of photoetching, and inject a second ion into the preset drain region; and perform a rapid annealing process on a structure in which ion injection is completed, to generate the source region and a drain region.

When the first ion and the second ion are injected, types of injected ions are related to a type of the TFET. For example, when the TFET is N-type, an ion injected into the source region is a P-type ion, and an ion injected into the drain region is an N-type ion; or when the TFET is P-type, an ion injected into the source region is an N-type ion, and an ion injected into the drain region is a P-type ion.

Figure 9:
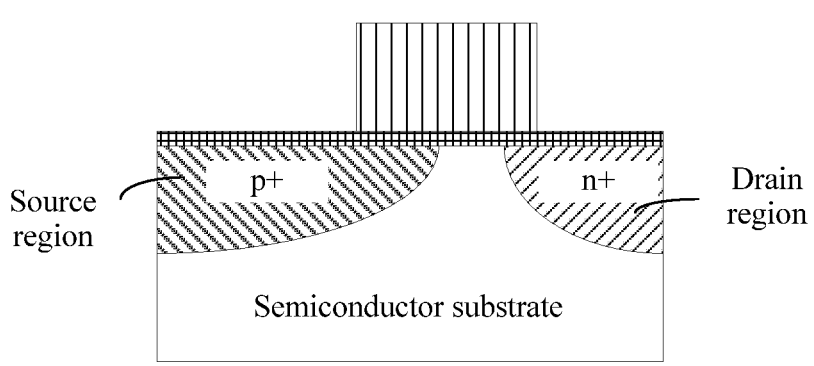
FIG. 9 is a schematic diagram of a source region and a drain region according to another embodiment of the present disclosure.

As shown in FIG. 9, FIG. 9 shows a schematic diagram of the source region and the drain region. A left doping area in FIG. 9 represents the source region, and a right doping area represents the drain region.

604. Remove an exposed protection layer, deposit a metal film in a first area in the source region, process the metal film by using the annealing process to obtain a metal layer in the first area, and remove a metal film that is not processed in the annealing process.

The exposed protection layer is a protection layer that is not covered by the sacrificial layer. If the protection layer is produced on the semiconductor substrate in step 602, the exposed protection layer needs to be first removed before the metal layer is deposited in the first area in the source region. Specifically, the exposed protection layer may be removed by means of etching.

After the metal film is deposited in the first area in the source region, when the annealing process is performed, metal constituting the metal film chemically reacts with a semiconductor in the source region to generate metal silicide such as silicon nitride. Therefore, the metal layer is actually made from the metal silicide.

Figure 10:
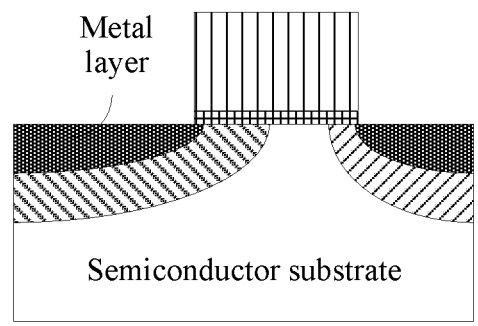
FIG. 10 is a schematic diagram of a metal layer according to another embodiment of the present disclosure.

Further, not all metal in the metal film can be exactly reacted with the semiconductor in the annealing process. Therefore, during metal layer generation, the metal film that is not processed in the annealing process needs to be removed. The metal film that is not processed in the annealing process may be removed by means of etching. As shown in FIG. 10, FIG. 10 shows a schematic diagram of the metal layer.

Optionally, the metal layer may be produced in the first area in the source region, and in addition, a metal layer may also be produced in a partial area in the drain region. A manner for producing the metal layer in the partial area in the drain region is the same as a manner for producing the metal layer in the first area in the source region. For details, refer to the manner for producing the metal layer in the first area in the source region. Details are not described in this embodiment of the present disclosure.

605. Remove a remaining protection layer and the sacrificial layer; and on an upper surface of the semiconductor substrate, successively grow a semiconductor film to serve as an initial pocket layer, grow a dielectric film by means of deposition to serve as an initial gate oxide layer, and deposit polycrystalline silicon or metal to serve as an initial gate region.

Materials of the initial pocket layer, the initial gate oxide layer, and the initial gate region are respectively the same as materials of the pocket layer, the gate oxide layer, and the gate region in the foregoing embodiments, and details are not described herein again.

Figure 11:
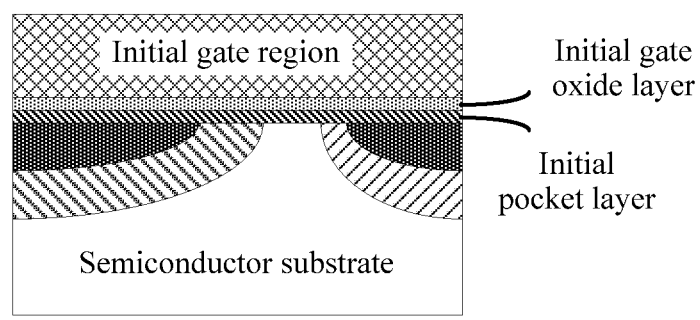
FIG. 11 is a schematic diagram of an initial pocket layer, an initial gate oxide layer, and an initial gate region according to another embodiment of the present disclosure.

As shown in FIG. 11, FIG. 11 shows a schematic diagram of the initial pocket layer, the initial gate oxide layer, and the initial gate region. In FIG. 11, the upper surface of the semiconductor substrate is entirely covered by the initial pocket layer, the initial gate oxide layer, and the initial gate region.

606. Process the initial pocket layer, the initial gate oxide layer, and the initial gate region according to preset shapes of a pocket layer, a gate oxide layer, and a gate region, to obtain the pocket layer, the gate oxide layer, and the gate region.

The pocket layer covers at least a part of the metal layer, and the other end of the pocket layer does not overlap with the drain region, so as to reduce an electric leakage possibility of the TFET, and improve performance of the TFET.

Specifically, the initial pocket layer, the initial gate oxide layer, and the initial gate region may be processed to obtain the pocket layer, the gate oxide layer, and the gate region by means of photoetching and anisotropic etching.

It should be noted that step 605 and step 606 are a specific implementation of successively growing the semiconductor film to serve as the pocket layer, growing the dielectric film by means of deposition to serve as the gate oxide layer, and depositing the polycrystalline silicon or metal to serve as the gate region on the partial area of the upper surface of the semiconductor substrate. In addition, an example in which the initial pocket layer, the initial gate oxide layer, and the initial gate region are first produced, and then are processed to obtain the pocket layer, the gate oxide layer, and the gate region is used in step 605 and step 606 for description. However, during generation of the pocket layer, the gate oxide layer, and the gate region, on the partial area of the upper surface of the semiconductor substrate, in a successive and direct manner according to the preset shapes of the pocket layer, the gate oxide layer, and the gate region, the semiconductor film may be grown to serve as the pocket layer, the dielectric film may be grown by means of deposition to serve as the gate oxide layer, and the polycrystalline silicon or metal may be deposited to serve as the gate region, so as to simplify a process procedure.

Figure 12:
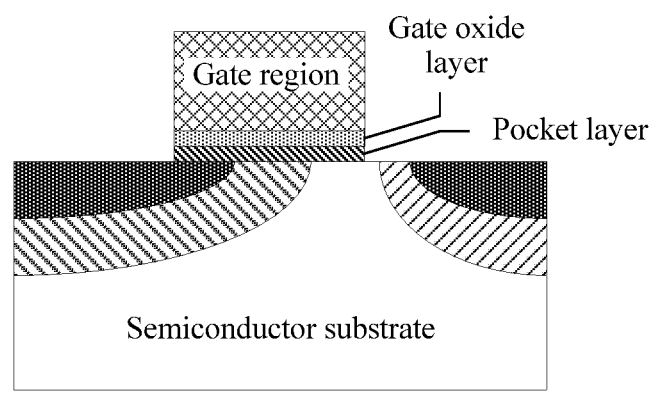
FIG. 12 is a schematic structural diagram of a pocket layer, a gate oxide layer, and a gate region according to another embodiment of the present disclosure.

As shown in FIG. 12, FIG. 12 shows a schematic structural diagram of the pocket layer, the gate oxide layer, and the gate region.

607. Produce an isolation wall on either side of the pocket layer, either side of the gate oxide layer, and either side of the gate region.

The isolation wall is made from an insulating material, such as silicon nitride. Specifically, the isolation wall may be produced on either side of the pocket layer, either side of the gate oxide layer, and either side of the gate region by means of anisotropic etching. The isolation wall is configured to isolate a subsequently produced metal source electrode, metal gate electrode, and metal drain electrode, so as to avoid a short circuit. In addition, disposing the isolation wall can ensure a bottom-up tunneling direction of the TFET, that is, the tunneling direction is vertical instead of horizontal.

Figure 13:
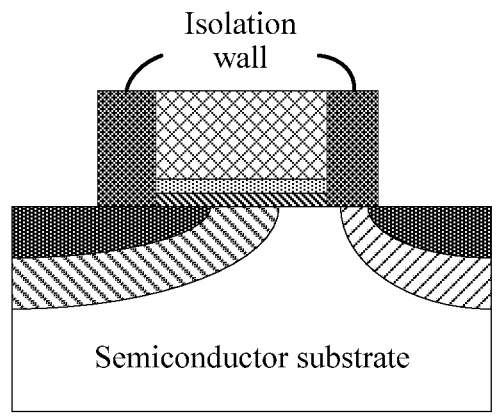
FIG. 13 is a schematic diagram of an isolation wall according to another embodiment of the present disclosure.

As shown in FIG. 13, FIG. 13 shows a schematic diagram of the isolation wall.

608. Fill a low dielectric material outside the isolation wall and the gate region, and respectively produce a metal source electrode, a metal gate electrode, and a metal drain electrode at specified locations in the source region, the gate region, and the drain region.

The low dielectric material may be silicon dioxide, silicon nitride, or the like. The metal source electrode, the metal gate electrode, and the metal drain electrode are respectively produced in specific areas in which the source region, the gate region, and the drain region are in contact with the low dielectric material. The low dielectric material is filled, so that a parasitic capacitor of the TFET can be relatively small. In addition, the low dielectric material can mechanically support the metal source electrode, the metal gate electrode, and the metal drain electrode.

Figure 14:
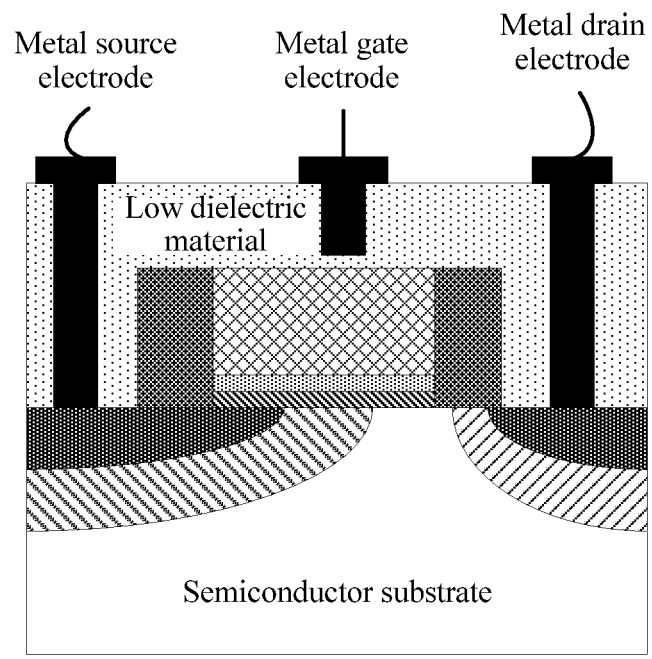
FIG. 14 is a schematic diagram of a low dielectric material, a metal source electrode, a metal gate electrode, and a metal drain electrode according to another embodiment of the present disclosure.

As shown in FIG. 14, FIG. 14 shows a schematic diagram of the low dielectric material, the metal source electrode, the metal gate electrode, and the metal drain electrode.

According to the TFET production method provided in this embodiment of the present disclosure, the metal layer is produced in the first area in the source region, so that the pocket layer and a second area in which a non-metal layer is located in the source region form a first tunnel junction of the TFET, and the pocket layer and the metal layer form a second tunnel junction of the TFET. In this structure, when a gate control voltage of the TFET is greater than a threshold voltage, the TFET is in an enabling state. In this case, tunneling occurs at both the first tunnel junction and the second tunnel junction, and the second tunnel junction is a Schottky tunnel junction formed by metal and a semiconductor. A Schottky barrier has a relatively great band control capability and can reduce a tunneling distance, and tunneling efficiency can be improved when the tunneling distance is reduced. Therefore, compared with tunneling efficiency of a TFET whose tunnel junction is formed by only a pocket layer and a source region, carrier tunneling efficiency of the TFET is higher, so that a tunneling current of the TFET can be increased. Therefore, the tunneling current is increased without increasing an area of the pocket layer, so that a layout area of the TFET is not excessively large, thereby improving TFET integration density on a chip.

It should be noted that in step 604 in the embodiment corresponding to FIG. 6, a manner for producing the metal layer in the first area in the source region is described by using an example of a manner for depositing the metal film in the first area in the source region, processing the metal film by using the annealing process to obtain the metal layer in the first area, and removing the metal film that is not processed in the annealing process. The metal layer production manner in step 604 is applicable when the pocket layer and the semiconductor substrate are made from a same material or different materials. However, in another embodiment, when the pocket layer and the semiconductor substrate are made from different materials, the metal layer may be produced in the first area in the source region in another manner. In this case, for the TFET production method, refer to content of an embodiment corresponding to FIG. 15.

Figure 15:
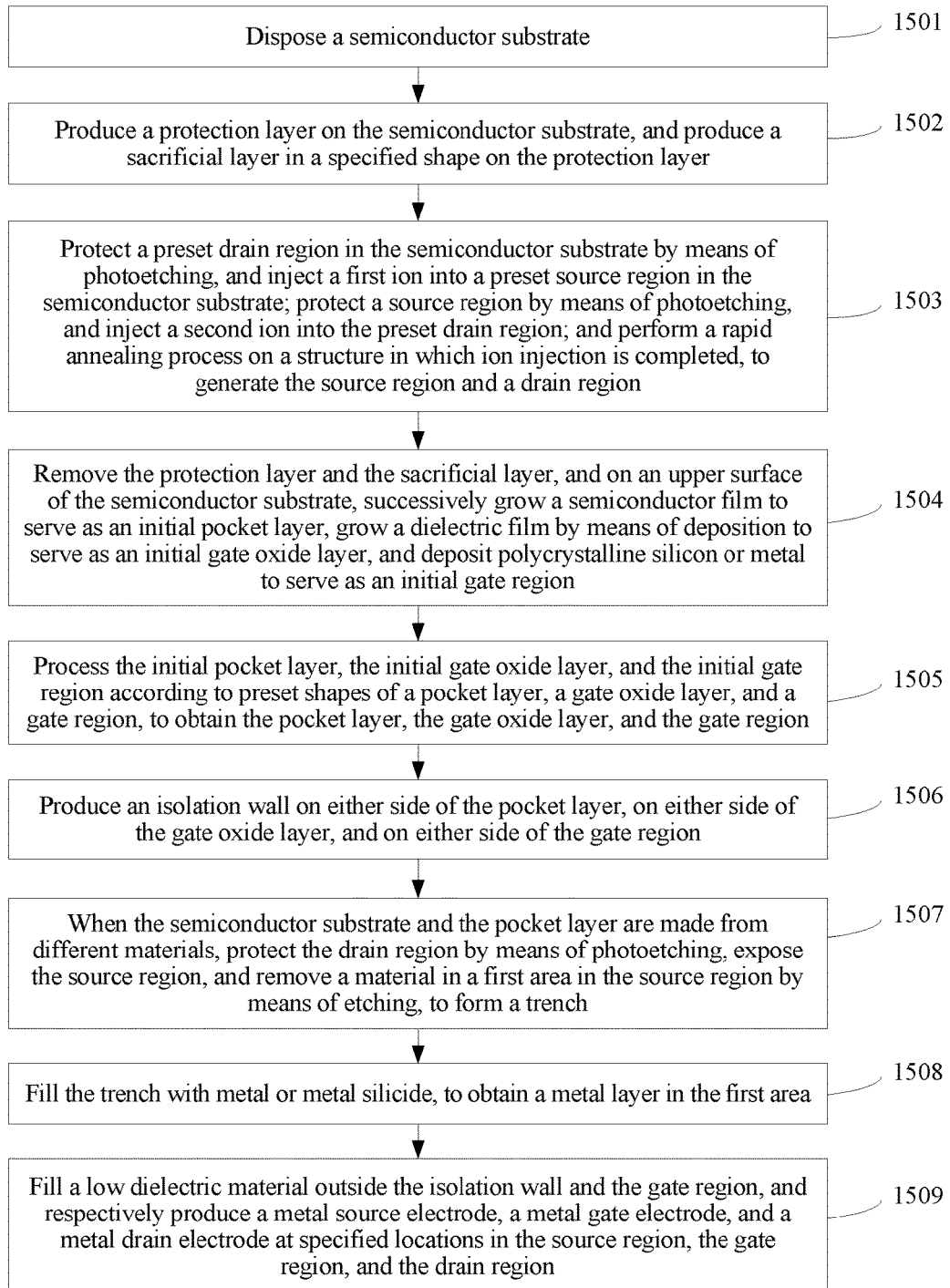
FIG. 15 is a flowchart of a TFET production method according to another embodiment of the present disclosure.

FIG. 15 is a flowchart of a TFET production method according to another embodiment of the present disclosure. As shown in FIG. 15, the production method provided in this embodiment of the present disclosure includes the following steps.

1501. Dispose a semiconductor substrate.

A principle of this step is consistent with a principle in step 601. For details, refer to content in step 601, and details are not described herein again. For a structure of the semiconductor substrate, still refer to FIG. 7.

1502. Produce a protection layer on the semiconductor substrate, and produce a sacrificial layer in a specified shape on the protection layer.

A principle of this step is consistent with a principle in step 602. For details, refer to content in step 602, and details are not described herein again. For structures of the protection layer and the sacrificial layer, still refer to FIG. 8.

1503. Protect a preset drain region in the semiconductor substrate by means of photoetching, and inject a first ion into a preset source region in the semiconductor substrate; protect a source region by means of photoetching, and inject a second ion into the preset drain region; and perform a rapid annealing process on a structure in which ion injection is completed, to generate the source region and a drain region.

Figure 16:
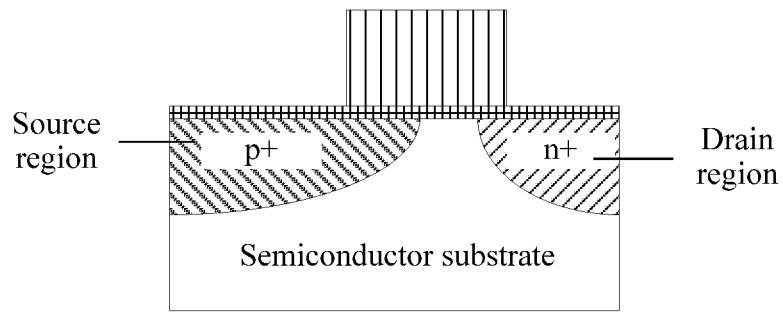
FIG. 16 is a schematic diagram of a source region and a drain region according to another embodiment of the present disclosure.

A principle of this step is consistent with a principle in step 603. For details, refer to content in step 603, and details are not described herein again. As shown in FIG. 16, FIG. 16 shows a schematic diagram of the source region and the drain region.

1504. Remove the protection layer and the sacrificial layer; and on an upper surface of the semiconductor substrate, successively grow a semiconductor film to serve as an initial pocket layer, grow a dielectric film by means of deposition to serve as an initial gate oxide layer, and deposit polycrystalline silicon or metal to serve as an initial gate region.

Specifically, the protection layer and the sacrificial layer may be entirely removed by means of etching.

Figure 17:
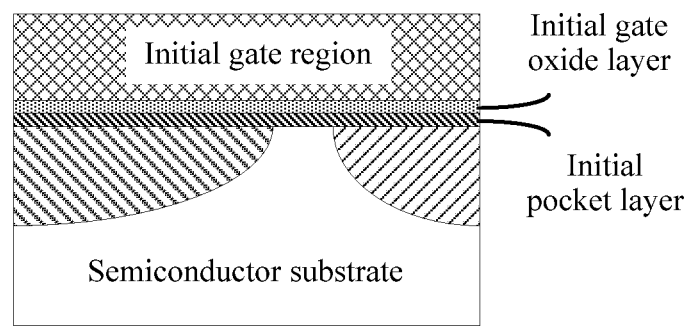
FIG. 17 is a schematic diagram of an initial pocket layer, an initial gate oxide layer, and an initial gate region according to another embodiment of the present disclosure.

In addition, a principle of successively growing the semiconductor film to serve as the initial pocket layer, growing the dielectric film by means of deposition to serve as the initial gate oxide layer, and depositing the polycrystalline silicon or metal to serve as the initial gate region on the upper surface of the semiconductor substrate is consistent with a principle in step 605 of successively growing the semiconductor film to serve as the initial pocket layer, growing the dielectric film by means of deposition to serve as the initial gate oxide layer, and depositing the polycrystalline silicon or metal to serve as the initial gate region on the upper surface of the semiconductor substrate. For details, refer to content in step 605, and details are not described herein again. As shown in FIG. 17, FIG. 17 shows a schematic diagram of the initial pocket layer, the initial gate oxide layer, and the initial gate region.

1505. Process the initial pocket layer, the initial gate oxide layer, and the initial gate region according to preset shapes of a pocket layer, a gate oxide layer, and a gate region, to obtain the pocket layer, the gate oxide layer, and the gate region.

A principle of this step is consistent with a principle in step 606. For details, refer to content in step 606, and details are not described herein again.

1506. Produce an isolation wall on either side of the pocket layer, either side of the gate oxide layer, and either side of the gate region.

Figure 18:
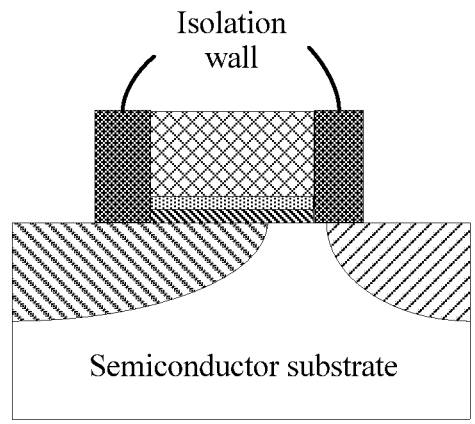
FIG. 18 is a schematic diagram of an isolation wall according to another embodiment of the present disclosure.

A principle of this step is consistent with a principle in step 607. For details, refer to content in step 607, and details are not described herein again. As shown in FIG. 18, FIG. 18 shows a schematic diagram of the isolation wall.

1507. When the semiconductor substrate and the pocket layer are made from different materials, protect the drain region by means of photoetching, expose the source region, and remove a material in a first area in the source region by means of etching, to form a trench.

The trench partially overlaps with the pocket layer. Specifically, the material in the first area in the source region may be removed by means of anisotropic etching such as wet etching.

Figure 19:
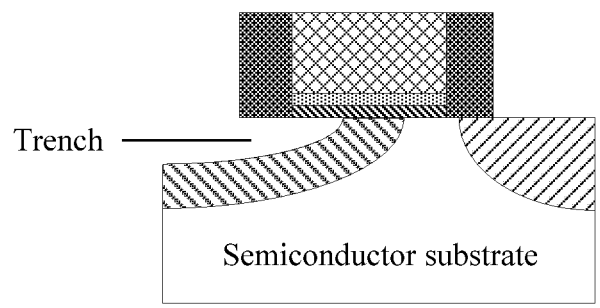
FIG. 19 is a schematic diagram of a trench according to another embodiment of the present disclosure.

As shown in FIG. 19, FIG. 19 shows a schematic diagram of the trench.

1508. Fill the trench with metal or metal silicide, to obtain a metal layer in the first area.

Figure 20:
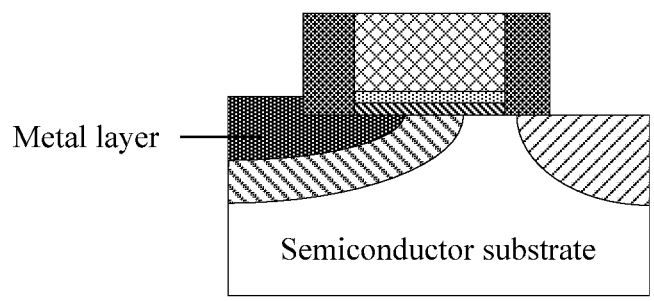
FIG. 20 is a schematic diagram of a metal layer according to another embodiment of the present disclosure.

As shown in FIG. 20, FIG. 20 shows a schematic diagram of the metal layer.

When the pocket layer and the semiconductor substrate are made from different materials, the metal layer may be produced in a manner in step 1507 and step 1508. Specifically, when the pocket layer and the semiconductor substrate are made from different materials, and the material in the first area in the source region is removed by means of etching, the pocket layer is not damaged. However, when the pocket layer and the semiconductor substrate are made from a same material, and the material in the first area in the source region is removed by means of etching, the pocket layer may also be removed. Therefore, a manner in step 1507 and step 1508 is applicable when the pocket layer and the semiconductor substrate are made from different materials.

1509. Fill a low dielectric material outside the isolation wall and the gate region, and respectively produce a metal source electrode, a metal gate electrode, and a metal drain electrode at specified locations in the source region, the gate region, and the drain region.

A principle of this step is consistent with a principle in step 608. For details, refer to content in step 608, and details are not described herein again.

Figure 21:
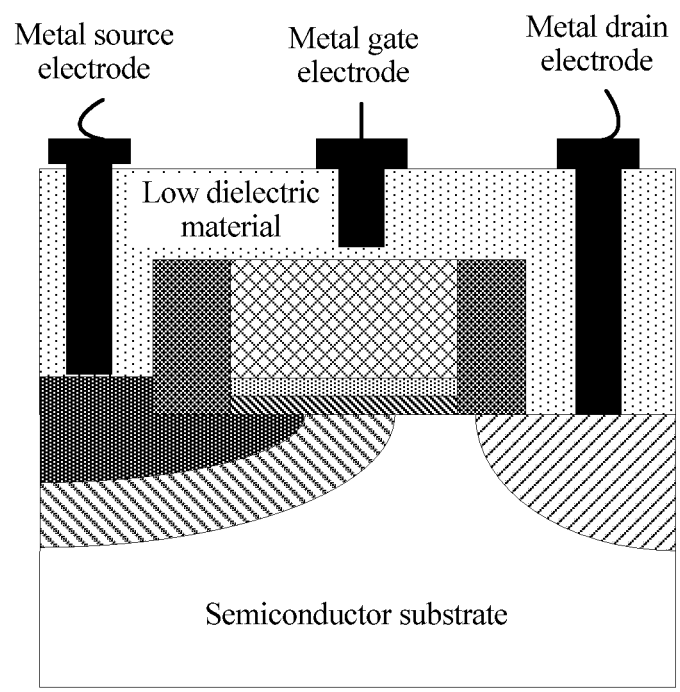
FIG. 21 is a schematic diagram of a low dielectric material, a metal source electrode, a metal gate electrode, and a metal drain electrode according to another embodiment of the present disclosure.

As shown in FIG. 21, FIG. 21 shows a schematic diagram of the low dielectric material, the metal source electrode, the metal gate electrode, and the metal drain electrode.

According to the TFET production method provided in this embodiment of the present disclosure, the metal layer is produced in the first area in the source region, so that the pocket layer and a second area in which a non-metal layer is located in the source region form a first tunnel junction of the TFET, and the pocket layer and the metal layer form a second tunnel junction of the TFET. In this structure, when a gate control voltage of the TFET is greater than a threshold voltage, the TFET is in an enabling state. In this case, tunneling occurs at both the first tunnel junction and the second tunnel junction, and the second tunnel junction is a Schottky tunnel junction formed by metal and a semiconductor. A Schottky barrier has a relatively great band control capability and can reduce a tunneling distance, and tunneling efficiency can be improved when the tunneling distance is reduced. Therefore, compared with tunneling efficiency of a TFET whose tunnel junction is formed by only a pocket layer and a source region, carrier tunneling efficiency of the TFET is higher, so that a tunneling current of the TFET can be increased. Therefore, the tunneling current is increased without increasing an area of the pocket layer, so that a layout area of the TFET is not excessively large, thereby improving TFET integration density on a chip.

Figure 22:
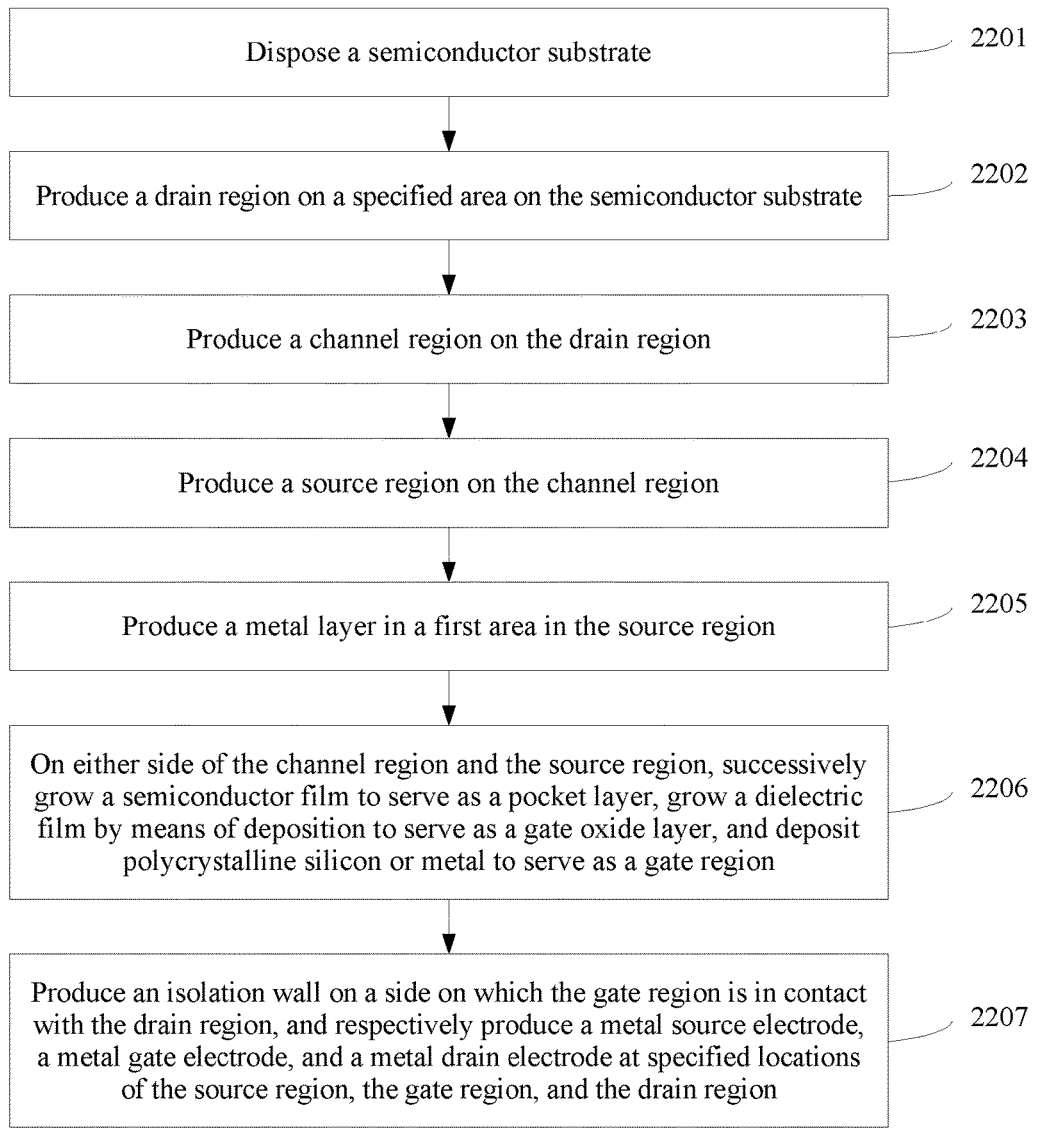
FIG. 22 is a flowchart of a TFET production method according to another embodiment of the present disclosure.

FIG. 22 is a flowchart of a TFET production method according to another embodiment of the present disclosure. The production method provided in this embodiment may be used to produce the TFET provided in the embodiment corresponding to FIG. 3 or FIG. 4. As shown in FIG. 22, the production method provided in this embodiment of the present disclosure includes the following steps.

2201. Dispose a semiconductor substrate.

A principle of this step is consistent with a principle in step 601. For details, refer to content in step 601, and details are not described herein again.

2202. Produce a drain region on a specified area on the semiconductor substrate.

A specific location of the specified area may be set with reference to an actual TFET production process. This is not limited in this embodiment of the present disclosure.

Specifically, the drain region on the semiconductor substrate may be produced by doping an ion with specific density in a semiconductor, or the like.

2203. Produce a channel region on the drain region.

For a channel region production manner, refer to an existing channel region production manner. This is not limited in this embodiment of the present disclosure.

2204. Produce a source region on the channel region.

Specifically, the source region is produced by producing a semiconductor on the channel region and doping an iron in a semiconductor layer, and this is not limited.

2205. Produce a metal layer in a first area in the source region.

Specifically, a principle of a metal layer production manner may be consistent with a metal layer production principle in step 604. For details, refer to content in step 604.

2206. On either side of the channel region and the source region, successively grow a semiconductor film to serve as a pocket layer, grow a dielectric film by means of deposition to serve as a gate oxide layer, and deposit polycrystalline silicon or metal to serve as a gate region.

A principle of this step is the same as principles in step 605 and step 606. For details, refer to content in step 605 and step 606, and details are not described herein again.

2207. Produce an isolation wall on a side on which the gate region is in contact with the drain region, and respectively produce a metal source electrode, a metal gate electrode, and a metal drain electrode at specified locations of the source region, the gate region, and the drain region.

For content such as a material, a production method, and a function of the isolation wall, refer to content in step 607, and details are not described herein again.

According to the TFET production method provided in this embodiment of the present disclosure, the metal layer is produced in the first area in the source region, so that the pocket layer and a second area in which a non-metal layer is located in the source region form a first tunnel junction of the TFET, and the pocket layer and the metal layer form a second tunnel junction of the TFET. In this structure, when a gate control voltage of the TFET is greater than a threshold voltage, the TFET is in an enabling state. In this case, tunneling occurs at both the first tunnel junction and the second tunnel junction, and the second tunnel junction is a Schottky tunnel junction formed by metal and a semiconductor. A Schottky barrier has a relatively great band control capability and can reduce a tunneling distance, and tunneling efficiency can be improved when the tunneling distance is reduced. Therefore, compared with tunneling efficiency of a TFET whose tunnel junction is formed by only a pocket layer and a source region, carrier tunneling efficiency of the TFET is higher, so that a tunneling current of the TFET can be increased. Therefore, the tunneling current is increased without increasing an area of the pocket layer, so that a layout area of the TFET is not excessively large, thereby improving TFET integration density on a chip.

The foregoing descriptions are merely optional embodiments of the present disclosure, but are not intended to limit the present disclosure. Any modification, equivalent replacement, and improvement made without departing from the spirit and principle of the present disclosure shall fall within the protection scope of the present disclosure.

What is claimed is:

1. A tunnel field-effect transistor, comprising:
   a channel region connecting a source region and drain region;
   a pocket layer disposed adjacent to least a portion of a metal layer, a portion of the source region, and a portion of a channel region;
   a gate oxide layer disposed between the pocket layer and a gate region, and not in contact with the channel region, and wherein the pocket layer is located on a side close to the source region;
   wherein the metal layer is disposed on a first area of the source region, wherein the first area is located on a side on which the source region is in contact with the pocket layer; and
   wherein the pocket layer and a second area in the source region form a first tunnel junction of the tunnel field-effect transistor, the pocket layer and the metal layer form a second tunnel junction of the tunnel field-effect transistor, and the second area is an area other than the first area in the source region.

2. The tunnel field-effect transistor according to claim 1, wherein:
   the source region and the drain region are formed on a semiconductor substrate;
   the pocket layer is disposed on a partial area of an upper surface of the semiconductor substrate that forms the channel region.

3. The tunnel field-effect transistor according to claim 2, further comprising:
   an isolation wall disposed on either side of the pocket layer, either side of the gate oxide layer, and either side of the gate region; and
   a metal source electrode, a metal gate electrode, and a metal drain electrode disposed at specified locations of the source region, the gate region, and the drain region, respectively, and wherein the isolation wall is configured to isolate the metal source electrode, the metal gate electrode, and the metal drain electrode.

4. The tunnel field-effect transistor according to claim 2, wherein:
   the semiconductor substrate comprises one of: bulk silicon, silicon-on-insulator, germanium-silicon, germanium, or an III-V compound semiconductor; and
   the pocket layer comprises one of: silicon, germanium-silicon, germanium, or an III-V compound semiconductor.

5. The tunnel field-effect transistor according to claim 2, wherein the semiconductor substrate and the pocket layer comprise a same material.

6. The tunnel field-effect transistor according to claim 1, wherein:
   the drain region is formed on a semiconductor substrate, the channel region is formed on a partial area in the drain region, and the source region is disposed on the channel region;
   the pocket layer entirely covers an area on either side of the source region and either side of the channel region; and
   the gate oxide layer and the gate region are disposed outside the pocket layer.

7. The tunnel field-effect transistor according to claim 6, further comprising:
   an isolation wall disposed on a side on which the gate layer is in contact with the drain region; and
   a metal source electrode, a metal gate electrode, and a metal drain electrode disposed at specified locations of the source region, the gate region, and the drain region, respectively, and wherein the isolation wall is configured to isolate the metal source electrode, the metal gate electrode, and the metal drain electrode.

8. The tunnel field-effect transistor according to claim 1, wherein:
   the gate region comprises polycrystalline silicon or metal; and
   the gate oxide layer comprises one of: silicon dioxide, silicon nitride, or a high dielectric material.

9. A method of fabricating a tunnel field-effect transistor, the method comprising:
forming a source region and a drain region and a channel region between the source region and the drain region;
forming a gate region;
forming a pocket layer;
forming a gate oxide layer between the pocket layer and the gate region, wherein the pocket layer is disposed on a side close to the source region and is not in contact with the channel region; and
forming a metal layer in a first area in the source region, wherein the first area is located on a side on which the source region is in contact with the pocket layer, the pocket layer covers at least a part of the metal layer, the pocket layer and a second area in the source region form a first tunnel junction of the tunnel field-effect transistor, and the pocket layer and the metal layer form a second tunnel junction of the tunnel field-effect transistor, wherein the second area is an area other than the first area in the source region.

10. The production method according to claim 9, wherein forming the source region and the drain region comprises:
forming the source region and the drain region on a semiconductor substrate;
forming the drain region on a specified area on the semiconductor substrate;
forming the channel region on the drain region; and
forming the source region on the channel region.

11. The production method according to claim 10, wherein forming a gate region, and forming a pocket layer and a gate oxide layer between the source region and the gate region, comprises:
on either side of the channel region and the source region, successively growing a semiconductor film to serve as the pocket layer, forming a dielectric film to serve as the gate oxide layer, and depositing polycrystalline silicon or metal to serve as the gate region.

12. The production method according to claim 10, wherein after forming a gate region and forming a pocket layer and a gate oxide layer between the source region and the gate region, the method further comprises:
forming an isolation wall on a side on which the gate region is in contact with the drain region; and
forming a metal source electrode, a metal gate electrode, and a metal drain electrode at specified locations of the source region, the gate region, and the drain region, respectively, and wherein the isolation wall is configured to isolate the metal source electrode, the metal gate electrode, and the metal drain electrode.

13. The production method according to claim 9, wherein after forming a metal layer in a first area in the source region, the method further comprises:
depositing a metal layer in a partial area in the drain region.

14. A method of fabricating a tunnel field-effect transistor, the method comprising:
forming a source region and a drain region and a channel region between the source region and the drain region, by:
forming the source region and the drain region in a semiconductor substrate;
protecting a preset drain region in the semiconductor substrate by photoetching, and injecting a first ion into a preset source region in the semiconductor substrate;
protecting the source region by photoetching, and injecting a second ion into the preset drain region; and
performing a rapid annealing process on a structure in which ion injection is completed, to generate the source region and the drain region;
forming a gate region;
forming a pocket layer and a gate oxide layer between the source region and the gate region, wherein the pocket layer is disposed on a side close to the source region; and
forming a metal layer in a first area in the source region, wherein the first area is located on a side on which the source region is in contact with the pocket layer, the pocket layer covers at least a part of the metal layer, the pocket layer and a second area in the source region form a first tunnel junction of the tunnel field-effect transistor, and the pocket layer and the metal layer form a second tunnel junction of the tunnel field-effect transistor, wherein the second area is an area other than the first area in the source region.

15. The production method according to claim 14, wherein before protecting a preset drain region in the semiconductor substrate by photoetching, and injecting a first ion into a preset source region in the semiconductor substrate, the method further comprises:
forming a protection layer on the semiconductor substrate and configured to protect the semiconductor substrate during ion injection into the preset source region and the preset drain region; and
forming a sacrificial layer in a specified shape on the protection layer, wherein the sacrificial layer is configured to form the channel region by self-alignment during ion injection into the preset source region and the preset drain region, and the channel region connects the source region and the drain region.

16. The production method according to claim 14, wherein forming a metal layer in a first area in the source region comprises:
depositing a metal film in the first area in the source region;
processing the metal film by using the rapid annealing process to obtain the metal layer in the first area; and
removing a metal film that is not processed in the annealing process.

17. The production method according to claim 14, wherein forming a metal layer in a first area in the source region comprises:
when the semiconductor substrate and the pocket layer are made from different materials, protecting the drain region by photoetching, exposing the source region, and removing a material in the first area in the source region to form a trench; and
filling the trench with metal or metal silicide to obtain the metal layer in the first area.

18. The production method according to claim 14, wherein forming a gate region, and forming a pocket layer and a gate oxide layer between the source region and the gate region, comprises:
on a partial area of an upper surface of the semiconductor substrate, successively growing a semiconductor film to serve as the pocket layer, forming a dielectric film to serve as the gate oxide layer, and depositing polycrystalline silicon or metal to serve as the gate region.

19. The production method according to claim 14, wherein after forming a gate region and forming a pocket layer and a gate oxide layer between the source region and the gate region, the method further comprises:
- forming an isolation wall on either side of the pocket layer, either side of the gate oxide layer, and either side of the gate region; and
- forming a metal source electrode, a metal gate electrode, and a metal drain electrode at specified locations of the source region, the gate region, and the drain region, respectively, and wherein the isolation wall is configured to isolate the metal source electrode, the metal gate electrode, and the metal drain electrode.

* * * * *